US009263118B2

(12) United States Patent
Yun et al.

(10) Patent No.: US 9,263,118 B2
(45) Date of Patent: Feb. 16, 2016

(54) SEMICONDUCTOR MEMORY DEVICE AND METHOD FOR OPERATING THE SAME

(71) Applicant: SK hynix Inc., Gyeonggi-do (KR)

(72) Inventors: Tae-Sik Yun, Gyeonggi-do (KR);
Jae-Bum Ko, Gyeonggi-do (KR);
Young-Jun Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/256,688

(22) Filed: Apr. 18, 2014

(65) Prior Publication Data

US 2015/0170722 A1     Jun. 18, 2015

(30) Foreign Application Priority Data

Dec. 18, 2013   (KR) .......................... 10-2013-0158541

(51) Int. Cl.
| | |
|---|---|
| *G11C 7/00* | (2006.01) |
| *G11C 11/4094* | (2006.01) |
| *G11C 11/4091* | (2006.01) |
| *G11C 7/10* | (2006.01) |
| *G11C 11/406* | (2006.01) |
| *G11C 11/4074* | (2006.01) |

(52) U.S. Cl.
CPC .......... *G11C 11/4094* (2013.01); *G11C 7/1048* (2013.01); *G11C 11/4091* (2013.01); *G11C 11/40615* (2013.01); *G11C 11/4074* (2013.01)

(58) Field of Classification Search
CPC ................... G11C 11/401615; G11C 11/4094
USPC .................................................. 365/203, 222
See application file for complete search history.

(56) References Cited

U.S. PATENT DOCUMENTS

2005/0122819 A1*   6/2005   Park et al. ..................... 365/226

FOREIGN PATENT DOCUMENTS

KR        1020100120878        11/2010

* cited by examiner

*Primary Examiner* — Son Mai
(74) *Attorney, Agent, or Firm* — IP & T Group LLP

(57) ABSTRACT

A semiconductor memory device includes a first pre-charge control block suitable for generating a first control signal by counting a number of toggles of an operation clock in response to a first active pulse in a self-refresh operation exit mode, a second pre-charge control block suitable for generating a second control signal in response to an active command for an active operation in a self-refresh operation mode, and an operation control block suitable for disabling the first pre-charge control block in the self-refresh operation mode, and disabling the second pre-charge control block in a self-refresh operation exit mode, wherein a pre-charge operation starts in response to the first and second control signals after the active operation. The semiconductor memory device may then be secured in a minimal time for stably performing an active operation during a self-refresh operation.

13 Claims, 4 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2013-0158541, filed on Dec. 18, 2013, which is incorporated herein by reference in its entirety.

BACKGROUND

1. Field

Exemplary embodiments of the present invention relate to a semiconductor design technology, and more particularly, to a semiconductor memory device capable of supporting a self-refresh operation.

2. Description of the Related Art

A unit memory cell of a typical Dynamic Random Access Memory (DRAM) device includes one transistor and one capacitor in which data is stored. The data stored in the capacitor formed over a semiconductor substrate may be damaged due to natural leakage. Therefore, a DRAM device has to perform a refresh operation periodically to recharge the memory cell with data. If the refresh operation is not performed stably, the data may be damaged, the read performance of the semiconductor memory device may be deteriorated, or the semiconductor memory device may malfunction.

The refresh operations are categorized into auto-refresh operations and self-refresh operations. The auto-refresh operation is performed while a semiconductor memory device performs a normal data input/output operation. The self-refresh operation is performed when the semiconductor memory device has not operated for a period of time, for example, while in standby mode or a power-saving mode. In short, the auto-refresh operation has to be performed while the semiconductor memory device is in the middle of performing a non al data input/output operation, the refresh operation is performed in response to an external refresh command inputted from an external source at a predetermined period. On the other hand, the self-refresh operation is performed while the semiconductor memory device is not performing any operation, and thus the refresh operation is performed at a predetermined period without receiving an external refresh command.

The refresh operation includes a series of processes of sensing and amplifying the data stored in the memory cells of a particular word line through an active operation, storing the data back in the memory cells of the word line, and pre-charging the word line. When the pre-charge operation is to be performed after the active operation begins is an important factor that needs to be considered in order to perform a stable refresh operation.

SUMMARY

An embodiment of the present invention is directed to a semiconductor memory device capable of securing a minimal active operation section TRAS_MIN to stably perform an active operation during a self-refresh operation.

In accordance with an embodiment of the present invention, a semiconductor memory device may include a first pre-charge control block suitable for generating a first control signal by counting a number of toggles of an operation clock in response to a first active pulse in a self-refresh operation exit mode, a second pre-charge control block suitable for generating a second control signal in response to an active command for an active operation in a self-refresh operation mode, and an operation control block suitable for disabling the first pre-charge control block in the self-refresh operation mode, and disabling the second pre-charge control block in a self-refresh operation exit mode, wherein a pre-charge operation starts in response to the first and second control signals after the active operation.

In accordance with another embodiment of the present invention, a method for operating a semiconductor memory device may include generating a first control signal by counting the number of toggles of an operation clock in response to a first active pulse, wherein the generating of the first control signal is disabled when a self-refresh operation signal is enabled, and generating a second control signal in response to an active command for an active operation when the self-refresh operation signal is enabled, wherein a pre-charge operation starts in response to the first and second control signals after the active operation.

DETAILED DESCRIPTION

Figure 1:
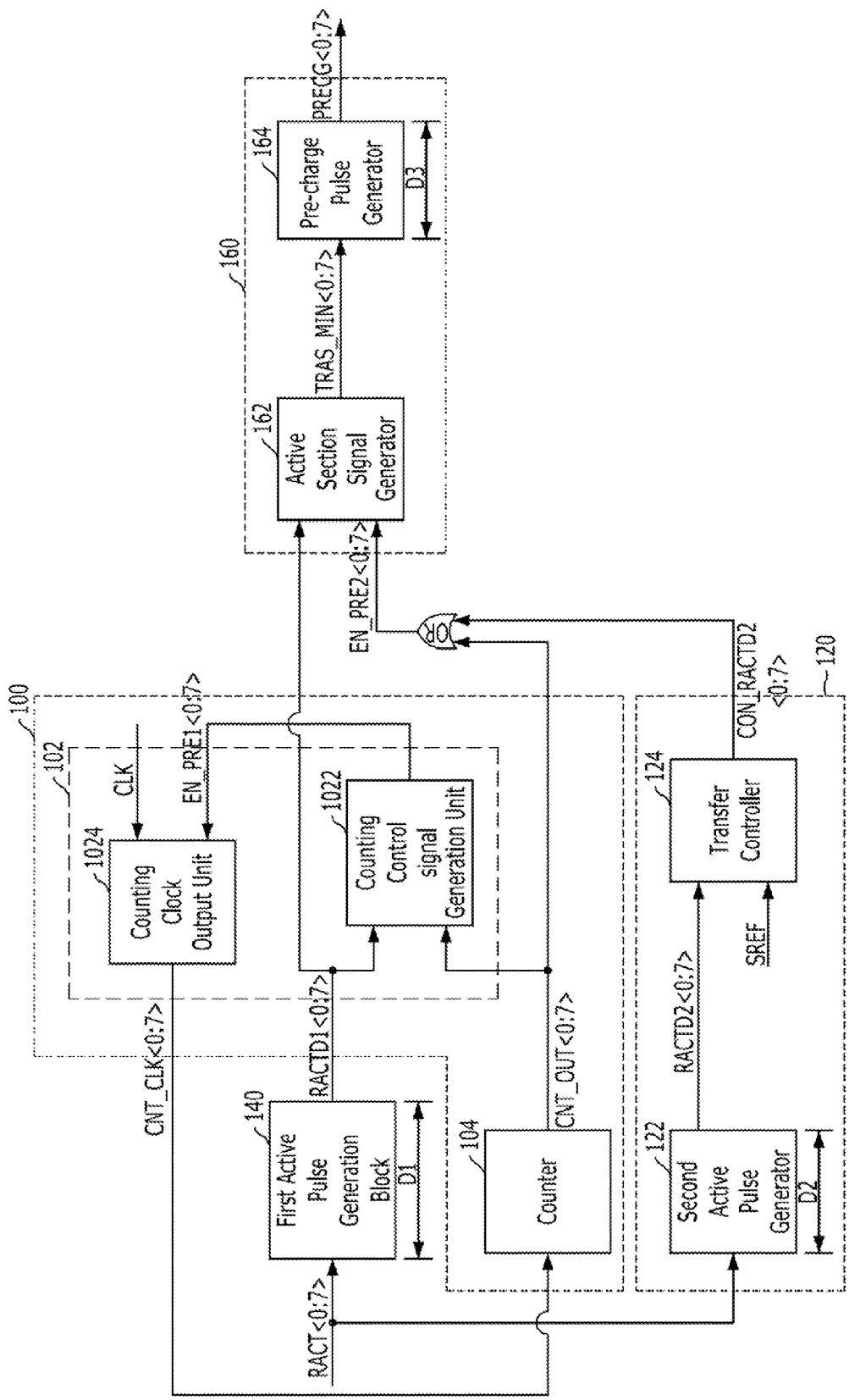
FIG. 1 is a block diagram illustrating a typical pre-charge control circuit of a semiconductor memory device.

Exemplary embodiments of the present invention will be described below in more detail with reference to the accompanying drawings. The present invention may, however, be embodied in different forms and should not be construed as limited to, the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a typical pre-charge control circuit of a semiconductor memory device. Referring to FIG. 1, the pre-charge control circuit includes a first pre-charge control block 100, a second pre-charge control block 120, a first active pulse generation block 140, and a pre-charge operation block 160. The first pre-charge control block 100 includes a counting clock generator 102 and a counter 104. Also, the counting clock generator 102 includes a counting control signal generation unit 1022 and a counting clock output unit 1024.

The second pre-charge control block 120 includes a second active pulse generator 122 and a transfer controller 124. The pre-charge operation block 160 includes an active section signal generator 162 and a pre-charge pulse generator 164.

The first active pulse generation block 140 generates the first active pulse RACTD1<0:7> toggling with a first time delay D1 in response to an active command RACT<0:7>.

The second pre-charge control block 120 decides when the pre-charge operation starts in response to the active command RACT<0:7>. In other words, the second pre-charge control block 120 generates and outputs a second active pulse CON_

RACTD2<0:7> having a second time delay D2 in response to the active command RACT<0:7> and a self-refresh operation signal SREF.

The second active pulse generator 122 of the second pre-charge control block 120 generates the second pre active pulse RACTD2<0:7> having the second time delay D2 in response to the active command RACT<0:7>.

The transfer controller 124 of the second pre-charge control block 120 outputs the second pre active pulse RACTD2<0:7> having the second time delay D2 as the second active pulse CON_RACTD2<0:7> in response to the self-refresh operation signal SREF.

The first pre-charge control block 100 counts the number of toggles of an operation clock CLK in response to the first active pulse RACTD1<0:7> outputted from the first active pulse generation block 140, and decides when a pre-charge operation starts based on the counting value.

The counter 104 of the first pre-charge control block 100 counts the number of toggles of a counting clock CNT_CLK 07>, generates a counting result pulse CNT_OUT<0:7> when the number of toggles of the counting clock CNT_CLK<0:7> reaches a predetermined number, and outputs the counting result pulse CNT_OUT<0:7> to the counting clock generator 102 and the pre-charge operation block 160.

The counting clock generator 102 of the first pre-charge control block 100 provides the counting clock CNT_CLK<0:7> based on the operation clock CLK in response to the first active pulse RACTD1<0:7> and the counting result pulse CNT_OUT<0:7>.

The counting control signal generation unit 1022 of the counting clock generator 102 generates a counting control signal EN_PRE1<0:7> which is enabled in response to the first active pulse RACTD1<0:7> outputted from the first active pulse generation block 140 and disabled in response to the counting result pulse CNT_OUT<0:7> outputted from the counter 104, thereby defining a counting section.

The counting clock output unit 1024 of the counting clock generator 102 generates the counting clock CNTCLK<0:7> in response to the operation clock CLK in the counting section, which is defined by enablement and disablement of the counting control signal EN_PRE1<0:7> outputted from the counting control signal generation unit 1022.

The pre-charge operation block 160 generates a pre-charge pulse PRECG<0:7> for controlling when the pre-charge operation starts in response to the first active pulse RACTD1<0:7> and one of the counting result pulses CNT_OUT<0:7> outputted from the first pre-charge control block 100, and the second active pulse CON_RACTD2<0:7> outputted from the second pre-charge control block 120.

The active section signal generator 162 of the pre-charge operation block 160 generates an active section signal TRAS_MIN<0:7> that is enabled in response to the first active pulse RACTD1<0:7> and disabled in response to one of the second active pulses CON_RACTD2<0:7> outputted from the transfer controller 124 and the counting result pulse CNT_OUT<0:7> outputted from the counter 104.

The pre-charge pulse generator 164 of the pre-charge operation block 160 senses the state shift of the active section signal TRAS_MIN<0:7> from an enabling state to a disabling state, and generates the pre-charge pulse PRECG<0:7> a third time delay D3 after the active section signal TRAS_MIN<0:7> shifts from the enabling state to the disabling state.

Figure 2:
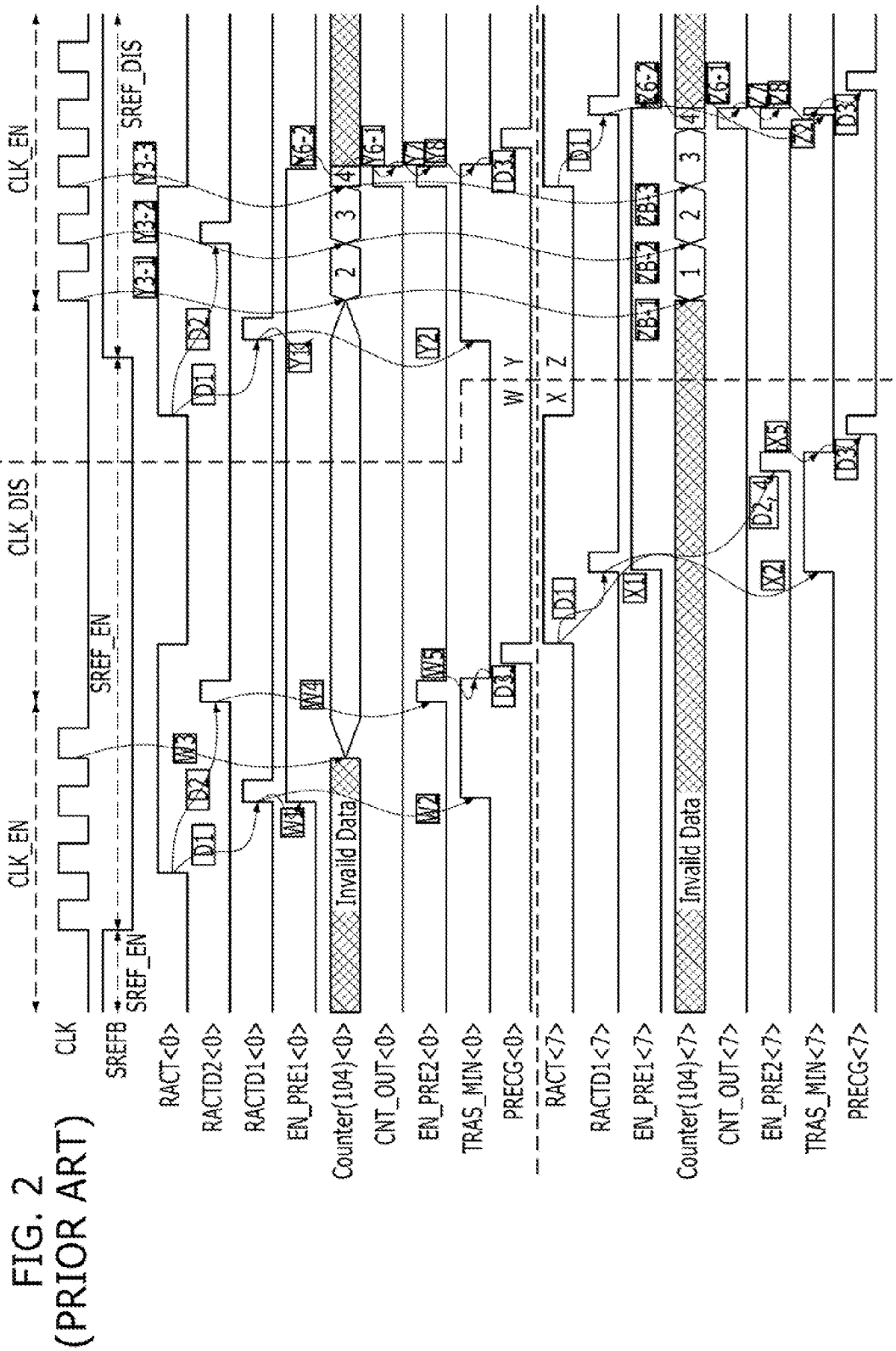
FIG. 2 is a timing diagram illustrating an operation of a typical pre-charge control circuit shown in FIG. 1.

FIG. 2 is a timing diagram illustrating the operation of atypical pre-charge control circuit shown in FIG. 1. The semiconductor memory device shown in FIG. 1 includes 8 banks (not shown). The semiconductor memory device uses a piled refresh operation scheme, in which the 8 banks are sequentially and iteratively refreshed at a predetermined interval to save internal power during a self-refresh operation. FIG. 2 shows the refresh operations of the first bank and the eighth bank of the 8 banks, which respectively come first and last in the order of the 8 banks.

There are two modes of the self-refresh operation: a self-refresh operation exit mode SREF_DIS, which is defined by disablement of the self-refresh operation signal SREF at a logic low level, and a self-refresh operation mode SREF_EN, which is defined by enablement of the self-refresh operation signal SREF at a logic high level.

The operation clock CLK falls into one of two sections: a clock enable section CLK_EN, where the operation clock CLK toggles, and a clock disable section CLK_DIS, where the operation clock CLK does not toggle. Since the semiconductor memory device is in standby mode in the self-refresh operation mode SREF_EN, the operation clock CLK does not have to toggle and thus falls into the clock disable section CLK_DIS. Therefore, theoretically, the time duration of the self-refresh operation mode SREF_EN corresponds to the clock disable section CLK_DIS. In the self-refresh operation exit mode SREF_DIS, the semiconductor memory device performs a normal data input/output operation, and the operation clock CLK needs to toggle and falls into the clock enable section CLK_EN. Therefore, the time duration of the self-refresh operation exit mode SREF_DIS corresponds to the clock disable section CLK_EN. However, as illustrated in FIG. 2, the time duration of the self-refresh operation mode SREF_EN and the clock disable section CLK_DIS do not coincide completely. This is because the operation clock CLK has to toggle for a predetermined time even after the self-refresh operation mode SREF_EN begins in order to perform the self-refresh operation normally.

When the self-refresh operation mode SREF_EN begins, the self-refresh operation for the first bank is performed in the following order (see W).

In response to an active command RACT<0> for the first bank, a first active pulse RACTD1<0> toggles after the first time delay D1, and the second pre active pulse RACTD2<0> toggles after the second time delay D2.

In response to the toggling of the first active pulse RACTD1<0>, a counting control signal EN_PRE1<0> is enabled (see W1). Likewise, an active section signal TRAS_MIN<0> is enabled (see W2) in response to the toggling of the first active pulse RACTD1<0>.

As illustrated in FIG. 2, the operation clock CLK toggles once after enablement of the counting control signal EN_PRE1<0>. Thus, the counter 104 performs a counting operation once (see W3) in response to one toggle of the operation clock CLK. Since the operation clock CLK does not toggle any more after the counter 104 performs the counting operation once (see W3), the counting operation is not performed any more, either.

Since the self-refresh operation signal SREF is enabled, the toggling of the second pre active pulse RACTD2<0> is transferred to the active section signal generator 162 through the transfer controller 124 (see W4). In response to the toggling of the second pre active pulse RACTD2<0> the active section signal TRAS_MIN<0> is disabled (see W5).

Sensing the disabling of the active section signal TRAS_MIN<0>, a pre-charge pulse PRECG<0> toggles after the third time delay D3.

It may be seen from the above description that the self-refresh operation for the first bank is activated in response to the active command RACT<0> in the self-refresh operation mode SREF_EN, and after a predetermined time, the first bank is pre-charged in response to the operation of the second pre-charge control block 120 toggling the pre-charge pulse PRECG<0>.

When the self-refresh operation mode SREF_EN begins, the self-refresh operation on the eighth bank is performed in the following order (see X).

Since the self-refresh operations are sequentially performed from the first bank to the eighth bank according to the piled refresh operation scheme, the self-refresh operation for the eighth bank is performed a predetermined time after the self-refresh operation for the first bank. The predetermined time, which is the time gap between the self-refresh operations for the first bank and the eighth bank, is pre-set.

In response to an active command RACT<7> for the eighth bank, a first active pulse RACTD1<7> toggles after the first time delay D1, and the second pre active pulse RACTD2<7> (not shown) toggles after the second time delay D2.

In response to the toggling of the first active pulse RACTD1<7>, a counting control signal EN_PRE1<7> is enabled (see X1). Likewise, an active section signal TRAS_MIN<7> is enabled (see X2) in response to the toggling of the first active pulse RACTD1<7>.

As illustrated in FIG. 2, since the operation clock CLK does not toggle when the counting control signal EN_PRE1<7> is enabled, the counter 104 performs no operations.

Since the self-refresh operation signal SREF is enabled, the toggling of the second pre active pulse RACTD2<7> is transferred to the active section signal generator 162 through the transfer controller 124 (see X4). In response to the toggling of the second pre active pulse RACTD2<7> the active section signal TRAS_MIN<7> is disabled (see X5).

Sensing the disabling of the active section signal TRAS_MIN<7>, a pre-charge pulse PRECG<7> toggles after the third time delay D3.

It may be seen from the above description that the refresh operation on the eighth bank is activated in response to the active command RACT<7> in the self-refresh operation mode SREF_EN and, after a predetermined time, the eighth bank is pre-charged in response to the operation of the second pre-charge control block 120 toggling the pre-charge pulse PRECG<7>.

As described above, it may be seen that the piled refresh operation on each of the 8 banks is performed during the self-refresh operation mode SREF_EN in response to the corresponding active command RACT<0:7> for each of the 8 banks and the operation of the second pre-charge control block 120. The active section signal TRAS_MIN<0:7> has a sufficient duration and it may be seen from this that the self-refresh operation for each of the 8 banks is sufficiently secured with the minimal time TRAS_MIN to stably perform an active operation during the self-refresh operation mode SREF_EN.

When the self-refresh operation mode SREF_EN is changed into the self-refresh operation exit mode SREF_DIS, the self-refresh operation for the first bank is performed in the following order (see Y).

As illustrated in section Y of FIG. 2, the self-refresh operation in response to the active command RACT<0> for the first bank at the time of entering into the self-refresh operation exit mode SREF_DIS is performed during the self-refresh operation exit mode SREF_DIS.

In response to the active command RACT<0> for the first bank, the first active pulse RACTD1<0> toggles after the first time delay D1, and the second pre active pulse RACTD2<0> toggles after the second time delay D2.

In response to the toggling of the first active pulse RACTD1<0> the counting control signal EN_PRE1<0> continues to be enabled (see Y1). The counting control signal EN_PRE1<0> stays enabled since the first active pulse RACTD1<0> has toggled for the first time right after the self-refresh operation mode SREF_EN begins. This is because the operation result CNT_COUT<0> of the counter 104 in the first pre-charge control block 100, which may disable the counting control signal EN_PRE1<0> is not generated until the number of toggles of the counting clock CNT_CLK<0:7> or the operation clock CLK reaches the predetermined number.

The toggling of the second pre active pulse RACTD2<0> is not transmitted to the active section signal generator 162 since the self-refresh operation signal SREF is disabled at the logic low level for the current self-refresh operation exit mode SREF_DIS, and thus the transfer controller 124 is disabled according to the disablement of the self-refresh operation signal SREF.

The active section signal TRAS_MIN 0> is enabled (see Y2) in response to the toggling of the first active pulse RACTD1<0>.

As described above, the counting control signal EN_PRE1<0> stays enabled in the beginning of the self-refresh operation exit mode SREF_DIS, where the operation clock CLK toggles. Therefore the counter 104 performs a counting operation continuously (see Y3-1, Y3-2 and Y3-3) in response to the continuous toggling of the operation clock CLK. When the number of toggles of the counting clock CNT_CLK<0:7> or the operation clock CLK reaches the predetermined number, for example, four times, the counter 104 generates the counting result pulse CNT_OUT<0> toggling according to the predetermined number, for example, four times (see Y6-1).

The counting control signal EN_PRE1<0> is then disabled in response to the counting result pulse CNT_OUT<0> (see Y6-2).

The counting result pulse CNT_OUT<0> is transferred (EN_PRE2<0>) to the active section signal generator 162 (see Y7) and the active section signal TRAS_MIN<0> is disabled in response to the counting result pulse CNT_OUT<0> by the active section signal generator 162.

Sensing the disabling of the active section signal TRAS_MIN<0> pre-charge pulse PRECG<0> toggles after the third time delay D3.

It may be seen from the above description that the self-refresh operation for the first bank in the self-refresh operation exit mode SREF_DIS is activated in response to the active command RACT<0, and when the toggling number of the operation clock CLK reaches the predetermined number, the first bank is pre-charged in response to the operation of the first pre-charge control block 100 toggling the pre-charge pulse PRECG<0>.

As illustrated in FIG. 2, when the self-refresh operation, in response to the active command RACT<0>, for the first bank, at the time of entering into the self-refresh operation exit mode SREF_DIS, is performed during the self-refresh operation exit mode SREF_DIS, the self-refresh operations for the other banks subsequent to the refresh operation for the first bank may also be performed in the self-refresh operation exit mode SREF_DIS.

Particularly, as shown in section Z of FIG. 2, the self-refresh operation for the eighth bank begins quite a long time after entering into the self-refresh operation exit mode SREF_DIS. Therefore, the operation clock CLK toggles before the self-refresh operation for the eighth bank begins, and thus the self-refresh operation for the eighth bank may not be normally performed.

The reason why the self-refresh operation for the eighth bank may not be normally performed is because the counting control signal EN_PRE1<7> for the eighth bank stays enabled when the refresh operation for the eighth bank is performed at least once before a self-refresh operation section, for example, in section X, and the enabled counting control signal EN_PRE1<7> allow the counter 140 to count the number of toggles of the operation clock CLK, which may lead to a short duration of the active section signal TRAS_MIN<7> and may cause an abnormal self-refresh operation for the eighth bank.

For this reason, although the active command RACT<7> for the eighth bank is not inputted, the counting operations (see Y3-1, Y3-2 and Y3-3) of the counter 104 for the first bank are performed simultaneously with the counting operations (see ZB-1, ZB-2 and ZB-3) of the counter 104 for the eighth bank. Therefore, the counting result pulse CNT_OUT<7> for the eighth bank toggles right after the active command RACT<7> for the eighth bank.

As a result, the first active pulse RACTD1<7> toggles after the first time delay D1 in response to the active command RACT<7> for the eighth bank, and then the active section signal TRAS_MIN<7> is enabled (see X2) in response to the toggling of the first active pulse RACTD1<7>. Subsequently, while the active section signal TRAS_MIN<7> does not stay enabled for enough time, the counting result pulse CNT_OUT<7> is transferred to the active section signal generator 162 (EN_PRE2<7>, see Z7) to disable the active section signal TRAS_MIN<7>.

The counting control signal EN_PRE1<7> is disabled in response to the toggling of the counting result pulse CNT_OUT<7> (see Z6-2).

The disabling of the active section signal TRAS_MIN<7> is sensed, and thereby the pre-charge pulse PRECG<7> toggles after the third time delay D3.

As described above, during the self-refresh operation for the eighth bank, the pre-charge pulse PRECG<7> toggles too quickly after the active command RACT<7>, and thus a sufficient enabled duration of the active section signal TRAS_MIN<7> is not secured. Therefore, the self-refresh operation for the eighth bank may not be secured within the minimal time TRAS_MIN to stably perform an active operation, and it is difficult to guarantee that the refresh operation is performed normally.

As describe above, the typical pre-charge control circuit illustrated in FIGS. 1 and 2 may not secure a sufficient time to stably perform the active operation for the self-refresh operation of a subsequent bank when the piled refresh operation for the 8 banks begins right before the self-refresh operation mode SREF_EN is changed into the self-refresh operation exit mode SREF_DIS.

Figure 3:
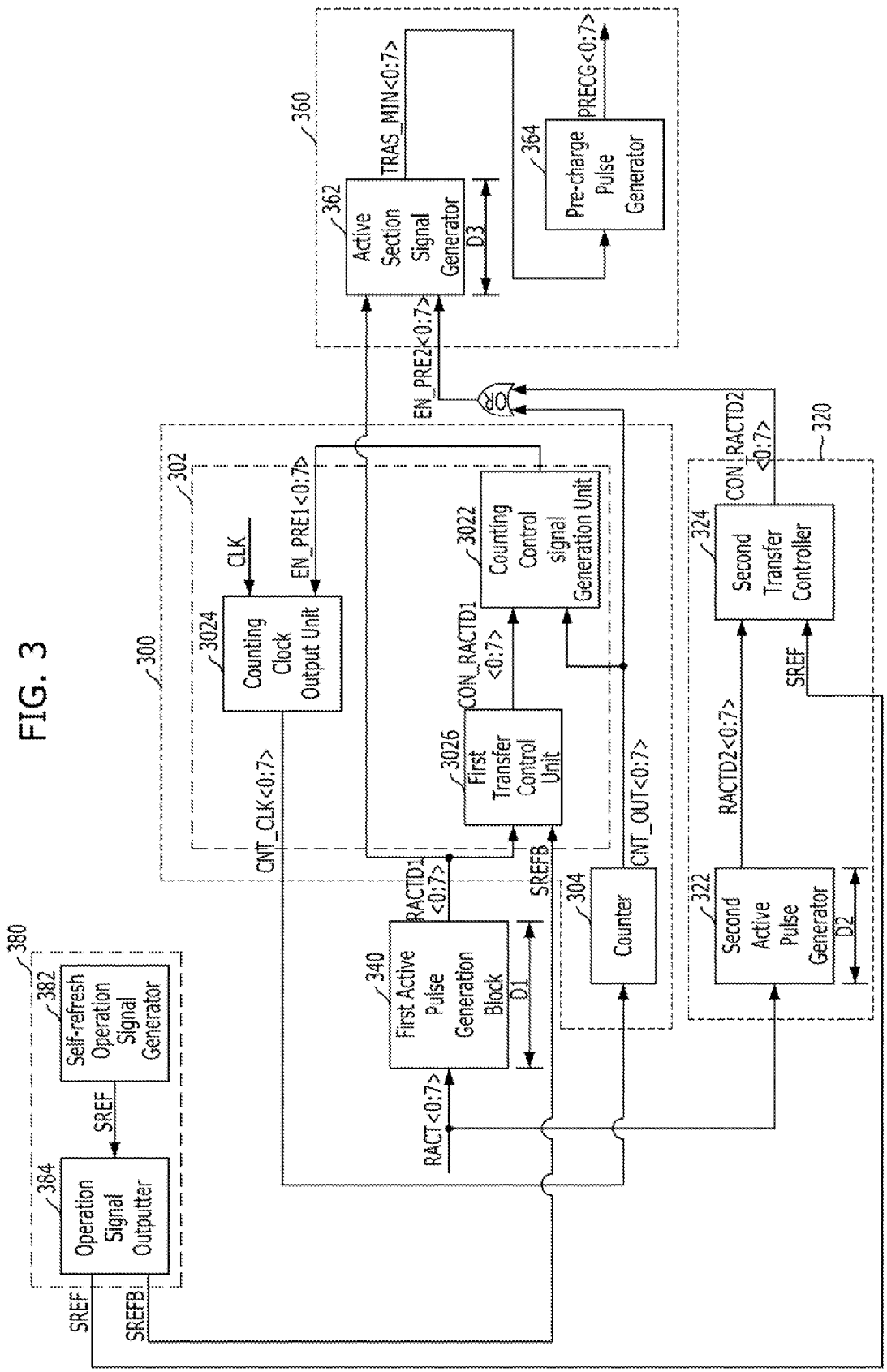
FIG. 3 is a block diagram illustrating a pre-charge control circuit of a semiconductor memory device in accordance with an embodiment of the present invention.

FIG. 3 is a block diagram illustrating a pre-charge control circuit of a semiconductor memory device in accordance with an embodiment of the present invention. Referring to FIG. 3, the pre-charge control circuit of a semiconductor memory device in accordance with an embodiment of the present invention may include a first pre-charge control block 300, a second pre-charge control block 320, a first active pulse generation block 340, a pre-charge operation block 360, and an operation control block 380. The first pre-charge control block 300 may include a counting clock generator 302 and a counter 304. The counting clock generator 302 may include a counting control signal generation unit 3022, a counting clock output unit 3024 and a first transfer control unit 3026.

The second pre-charge control block 320 may include a second active pulse generator 322 and a second transfer controller 324. The pre-charge operation block 360 may include an active section signal generator 362 and a pre-charge pulse generator 364. The operation control block 380 may include a self-refresh operation signal generator 382 and an operation signal outputter 384.

The operation control block 380 may disable the counting operation of the first pre-charge control block 300 in the self-refresh operation mode SREF_EN, and disable the operation of the second pre-charge control block 320 in the self-refresh operation exit mode SREF_DIS. The operation control block 380 may enable the operation of the second pre-charge control block 320 in the self-refresh operation mode REF_EN, and enable the counting operation of the first pre-charge control block 300 in the self-refresh operation exit mode SREF_DIS.

The self-refresh operation signal generator 382 of the operation control block 380 may generate a self-refresh operation signal SREF that may be enabled in the self-refresh operation mode SREF_EN and disabled in the self-refresh operation exit mode SREF_DIS.

The operation signal outputter 384 of the operation control block 380 may output a self-refresh operation bar signal SREFB, which is an inverted signal of the self-refresh operation signal SREF, to the first transfer control unit 3026, and output the self-refresh operation signal SREF to the second transfer controller 324.

The first active pulse generation block 340 may generate the first active pulse RACTD1<0:7> toggling with the first time delay D1 in response to the active command RACT<0:7>.

The second pre-charge control block 320 may decide when the pre-charge operation starts in response to the active command RACT<0:7>. In other words, the second pre-charge control block 320 may generate a second active pulse RACTD2<0:7> having the second time delay D2 in response to the active command RACT<0:7> and the self-refresh operation signal SREF outputted from the self-refresh operation signal generator 382, and may output the generated second active pulse RACTD2<0:7> to the pre-charge operation block 360. Whether to perform the operation of the second pre-charge control block 320 is decided based on the self-refresh operation signal SREF of the operation control block 380.

The second active pulse generator 322 of the second pre-charge control block 320 may generate the second pre active pulse RACTD2<0:7> having the second time delay D2 in response to the active command RACT<0:7>.

The second transfer controller 324 of the second pre-charge to control block 320 may selectively output the second pre active pulse RACTD2<0:7> as the second active pulse CON_RACTD2<0:7> to be transferred to the pre-charge operation block 360 in response to the self-refresh operation signal SREF of the operation control block 380. The second transfer controller 324 may be enabled and operate in the self-refresh operation mode SREF_EN in response to the enabled self-refresh operation signal SREF, and may be disabled and may not operate in the self-refresh operation exit mode SREF_DIS in response to the disablement of the self-refresh operation signal SREF.

The first pre-charge control block 300 may count the number of toggles of an operation clock CLK in response to first active pulse RACTD1<0:7> outputted from the first active pulse generation block 340, and decides when a pre-charge operation starts based on the counting value.

The counter 304 of the first pre-charge control block 300 may count the number of toggles of the counting clock CNT_CLK<0:7>, generate a counting result pulse CNT_OUT<0:7> when the number of toggles of the counting clock CNT_CLK<0:7> reaches a predetermined number, and may output the counting result pulse CNT_OUT<0:7> to the counting clock generator 302 and the pre-charge operation block 360.

The counting clock generator 302 of the first pre-charge control block 300 may generate the counting clock CNT_CLK<0:7> based on the operation clock CLK in response to the first active pulse RACTD1<0:7> and the counting result pulse CNT_OUT<0:7>. However, the self-refresh operation bar signal SREFB outputted from the operation control block 380 may control the operation of the counting clock generator 302.

The first transfer control unit 3026 of the counting clock generator 302 may transfer the first active pulse RACTD1<0:7> to the counting control signal generation unit 3022 in response to the self-refresh operation bar signal SREFB of the operation control block 380. The first transfer control unit 3026 may be enabled and operate in the self-refresh operation exit mode SREF_DIS in response to the disablement of the self-refresh operation signal SREF, and may be disabled and may not operate in the self-refresh operation mode SREF_EN in response to the enablement of the self-refresh operation signal SREF.

The counting control signal generation unit 3022 of the counting clock generator 302 may generate a counting control signal EN_PRE1<0:7> which is enabled in response to the first active pulse RACTD1<0:7>, which is transferred from the first active pulse generation block 340 through the first transfer control unit 3026, and disabled in response to the counting result pulse CNT_OUT<0:7> outputted from the counter 304, thereby defining a counting section.

The counting clock output unit 3024 of the counting clock generator 302 may generate the counting clock. CNT_CLK<0:7> in response to the operation clock CLK in the counting section, which is defined by enablement and disablement of the counting control signal EN_PRE1<0:7> outputted from the counting control signal generation unit 3022.

The pre-charge operation block 360 may generate a pre-charge pulse PRECG<0:7> for controlling when the pre-charge operation starts in response to the first active pulse RACTD1<0:7> and one of the counting result pulses CNT_OUT<0:7> outputted from the first pre-charge control block 300, and the second active pulse CON_RACTD2<0:7> outputted from the second pre-charge control block 320.

The active section signal generator 362 of the pre-charge operation block 360 may generate an active section signal TRAS_MIN<0:7> that is enabled in response to the first active pulse RACTD1<0:7> and disabled in response to one of the counting result pulses CNT_OUT<0:7> outputted from the counter 304, and the second active pulse CON_RACTD2<0:7> outputted from the second transfer controller 324.

The pre-charge pulse generator 364 of the pre-charge operation block 360 may sense the state shift of the active section signal TRAS_MIN<0:7> from an enabling state to a disabling state, and generate the pre-charge pulse PRECG<0:7> a third time delay D3 after the active section signal TRAS_MIN<0:7> shifts from the enabling state to the disabling state.

Figure 4:
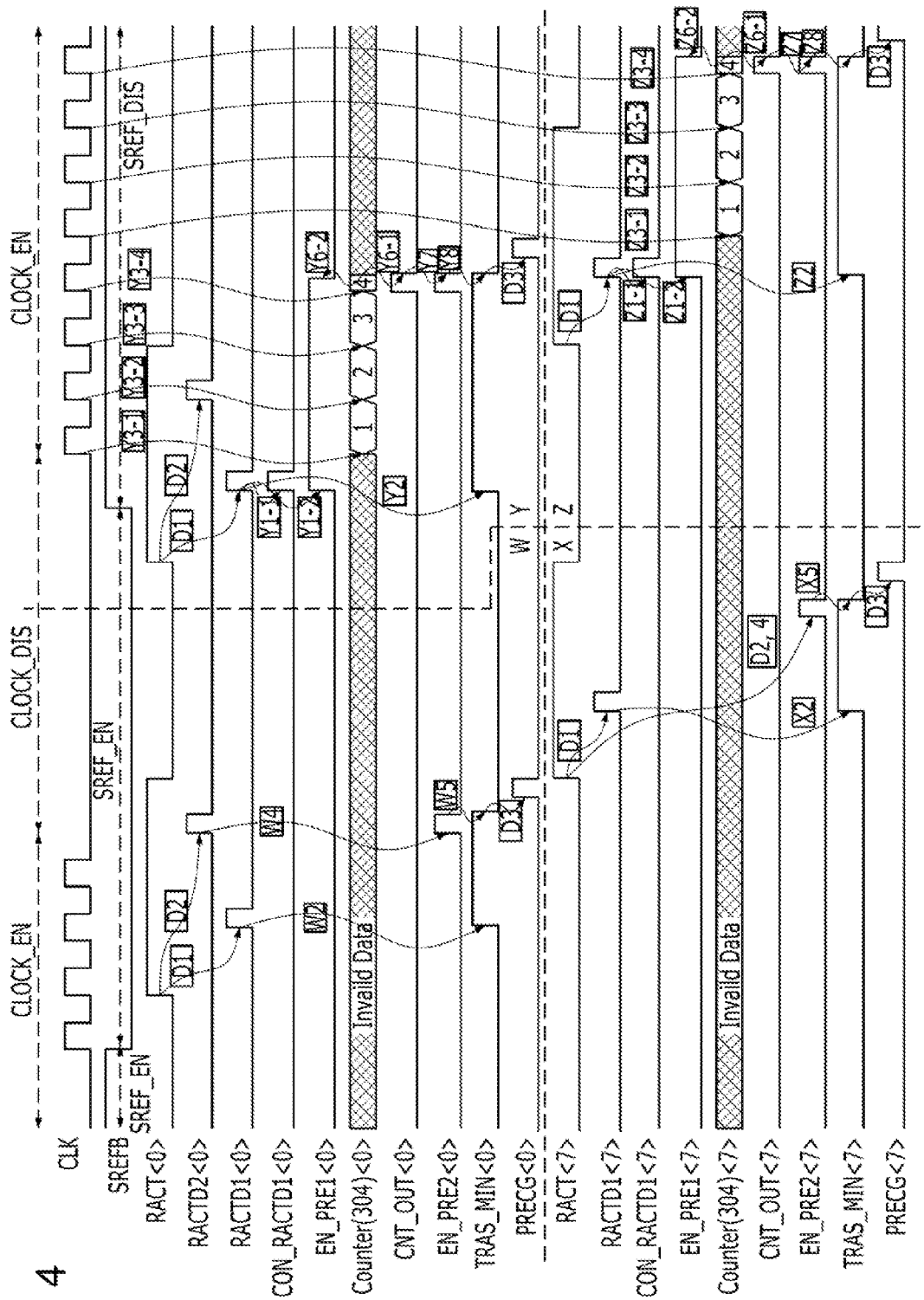
FIG. 4 is a timing diagram illustrating an operation of the pre-charge control circuit shown in FIG. 3.

FIG. 4 is a timing diagram illustrating an operation of the pre-charge control circuit shown in FIG. 3. The semiconductor memory device of FIG. 3 may include 8 banks (not shown). The semiconductor memory device may use a piled refresh operation scheme, in which the 8 banks are sequentially and iteratively refreshed at a predetermined interval to save internal power during a self-refresh operation. FIG. 4 shows the refresh operations of the first bank and the eighth bank of the 8 banks which respectively come first and last in the order of the 8 banks.

There may be two modes of the self-refresh operation: a self-refresh operation exit mode SREF_DIS, which is defined by disablement of the self-refresh operation signal SREF at a logic low level, and a self-refresh operation mode SREF_EN, which is defined by enablement of the self-refresh operation signal SREF at a logic high level.

The operation clock CLK may fall into one of two sections: a clock enable section CLK_EN, where the operation clock CLK toggles, and a clock disable section CLK_DIS, where the operation clock CLK does not toggle Since the semiconductor memory device is in a standby mode in the self-refresh operation mode SREF_EN, the operation clock CLK does not have to toggle and thus falls into the clock disable section CLK_DIS. Therefore, theoretically, the time duration of the self-refresh operation mode SREF_EN corresponds to the clock disable section CLK_DIS. In the self-refresh operation exit mode SREF_DIS, the semiconductor memory device performs a normal data input/output operation, and the operation clock CLK needs to toggle and falls into the clock enable section CLK_EN. Therefore, the time duration of the self-refresh operation exit mode SREF_DIS corresponds to the clock disable section CLK_EN. However, as illustrated in FIG. 4, the time duration of the self-refresh operation mode SREF_EN and the clock disable section CLK_DIS do not coincide completely. This is because the operation clock CLK has to toggle for a predetermined time after the self-refresh operation mode SREF_EN begins in order to perform the self-refresh operation normally.

When the self-refresh operation mode SREF_EN begins, the self-refresh operation for the first bank is performed in the following order (see W).

In response to an active command RACT<0> for the first bank, a first active pulse RACTD1<0> toggles after the first time delay D1, and the second pre active pulse RACTD2<0> toggles after the second time delay D2.

An active section signal TRAS_MIN<0> is enabled (see W2) in response to the toggling of the first active pulse RACTD1<0>.

Since the self-refresh operation signal SREF is enabled, the first transfer control unit 3026 may be disabled and may not operate. Thus, the toggling of the first active pulse RACTD1<0> may not be transferred to the counting control signal generation unit 3022. Therefore, the counting control signal EN_PRE1<0> may stay disabled regardless of the toggling of the first active pulse RACTD1<0>.

Since the self-refresh operation signal SREF is enabled, the toggling of the second pre active pulse RACTD2<0> may be transferred to the active section signal generator 362 through the second transfer controller 324 (see W4). In response to the toggling of the second pre active pulse RACTD2<0>, the active section signal TRAS_MIN<0> is disabled (see W5).

Sensing the disabling of the active section signal TRAS_MIN<0>, a pre-charge pulse PRECG<0> toggles after the third time delay D3.

It may be seen from the above description that the self-refresh operation for the first bank may be activated in response to the active command RACT<0> in the self-refresh operation mode SREF_EN, and after a predetermined time, the first bank is pre-charged in response to the operation of the second pre-charge control block 320 toggling the pre-charge pulse PRECG<0>.

When the self-refresh operation mode SREF_EN begins, the self-refresh operation on the eighth bank is performed in the following order (see X).

Since the self-refresh operations are sequentially performed from the first bank to the eighth bank according to the piled refresh operation scheme, the self-refresh operation for the eighth bank is performed a predetermined time after the self-refresh operation for the first bank. The predetermined time, which is the time gap between the self-refresh operations for the first bank and the eighth bank, is pre-set.

In response to an active command RACT<7> for the eighth bank, a first active pulse RACTD1<7> toggles after the first time delay D1, and the second pre active pulse RACTD2<7> (not shown) toggles after the second time delay D2.

An active section signal TRAS_MIN<7> is enabled (seeX2 response to the toggling of the first active pulse RACTD1<7>.

Since the self-refresh operation signal SREF is enabled, the first transfer control unit 3026 may be disabled and may not operate. Thus, the toggling of the first active pulse RACTD1<7> may not be applied to the counting control signal generation unit 3022. Therefore, the counting control signal EN_PRE1<7> may stay disabled regardless of the toggling of the first active pulse RACTD1<7>.

Since the self-refresh operation signal SREF is enabled, the toggling of the second pre active pulse RACTD2<7> may be transferred to the active section signal generator 362 through the second transfer controller 324 (see X4). In response to the toggling of the second pre active pulse RACTD2<7>, the active section signal TRAS_MIN<7> is disabled (see X5).

Sensing the disabling of the active section signal TRAS_MIN<7, a pre-charge pulse PRECG<7> toggles after the third time delay D3.

It may be seen from the above description that the self-refresh operation on the eighth bank may be activated in response to the active command RACT<7> in the self-refresh operation mode SREF_EN, and after a predetermined time, the eighth bank is pre-charged in response to the operation of the second pre-charge control block 320 toggling the pre-charge pulse PREcG<7>.

As described above, it may be seen that the piled refresh operation on each of the 8 banks is performed during the self-refresh operation mode SREF_EN in response to the corresponding active command RACT<0:7> for each of the 8 banks and the operation of the second pre-charge control block 320. The active section signal TRAS_MIN<0:7> has a sufficient duration and it may be seen from this that the refresh operation for each of the 8 banks is sufficiently secured with the minimal time TRAS_MIN to stably perform an active operation during the self-refresh operation mode SREF_EN.

When the self-refresh operation mode SREF_EN is changed into the self-refresh operation exit mode SREF_DIS, the self-refresh operation for the first bank is performed in the following order (see Y).

As illustrated in section Y of FIG. 4, the self-refresh operation in response to the active command RACT<0> for the first bank at the time of entering into the self-refresh operation exit mode SREF_DIS may be performed during the self-refresh operation exit mode SREF_DIS.

In response to the active command RACT<0 for the first bank, the first active pulse RACTD1<0> toggles after the first time delay D1, and the second pre active pulse RACTD2<0> toggles after the second time delay D2.

In response to the toggling of the first active pulse RACTD1<0>, the counting control signal EN_PRE1<0> is enabled (see Y1-1 and Y1-2). In other words, the first active pulse RACTD1<0> toggles during the self-refresh operation exit mode SREF_DIS, in which the self-refresh operation signal SREF is disabled, and thus the first transfer control unit 3026 enabled by the self-refresh operation bar signal SREFB may transfer the first active pulse RACTD1<0> to the counting control signal generation unit 3022 (see Y1-1) to enable the counting control signal EN_PRE1<0> (see Y1-2).

The toggling of the second pre active pulse RACTD2<0> may not be transmitted to the active section signal generator 362 since the self-refresh operation signal SREF is disabled at the logic low level for the current self-refresh operation exit mode SREF_DIS, and thus the second transfer controller 324 may be disabled according to the disablement of the self-refresh operation signal SREF.

An active section signal TRAS_MIN<0> may be enabled (see Y2) in response to the toggling of the first active pulse RACTD1<0>.

As described above, the counting control signal EN_PRE1<0> may be firstly enabled in the beginning of the self-refresh operation exit mode SREF_DIS (see Y1-1 and Y1-2), in which the operation clock CLK toggles. Therefore, the counter 304 may perform a counting operation (see Y3-1, Y3-2 and Y3-3) in response to the continuous toggling of the operation clock CLK. When the number of toggles of the counting clock CNT_CLK<0:7> or the operation clock CLK reaches the predetermined number, for example, four times, the counter 304 may generate the counting result pulse CNT_OUT<0> toggling according to the predetermined number, for example, four times (see Y6-1).

The counting control signal EN_PRE1<0> may then be disabled in response to the counting result pulse CNT_OUT<0> (see Y6-2).

The counting result pulse CNT_OUT<0> may be transferred to the active section signal generator 362 (see Y7), and the active section signal TRAS_MIN<0> may be disabled in response to the counting result pulse CNT_OUT<0> by the active section signal generator 362.

Sensing the disabling of the active section signal TRAS_MIN<0>, a pre-charge pulse PRECG<0> toggles after the third time delay D3.

It may be seen from the above description that the self-refresh operation for the first bank in the self-refresh operation exit mode SREF_DIS may be activated in response to the active command RACT<0>, and when the toggling number of the operation clock CLK reaches the predetermined number, the first bank may be pre-charged in response to the operation of the first pre-charge control block 100 toggling the pre-charge pulse PRECG<0>.

As illustrated in FIG. 4, when the self-refresh operation in response to the active command RACT<0> for the first bank at the time of entering into the self-refresh operation exit mode SREF_DIS is performed during the self-refresh operation exit mode SREF_DIS, the self-refresh operation for the eighth bank may be performed a predetermined time after the self-refresh operation for the first bank in the self-refresh operation exit mode SREF_DIS.

In short, the self-refresh operation for the eighth bank may be performed, such as an auto-refresh operation, a predetermined time after the self-refresh operation for the first bank in the self-refresh operation exit mode SREF_DIS.

To be specific, the refresh operation for the eighth bank, after the self-refresh operation for the first bank at the time of mode change from the self-refresh operation mode SREF_EN to the self-refresh operation exit mode SREF_DIS, is performed in the following order (see Z).

In response to the active command RACT<7> for the eighth bank, the first active pulse RACTD1<7> toggles after the first time delay D1, and then the second pre active pulse RACTD2<7> toggles after the second time delay D2.

In response to the toggling of the first active pulse RACTD1<7>, the counting control signal EN_PRE1<7> is enabled (see Z1-1 and Z1-2). In other words, the first active pulse RACTD1<7> toggles during the self-refresh operation exit mode SREF_DIS, in which the self-refresh operation signal SREF is disabled, and thus the first transfer control unit 3026 enabled by the self-refresh operation bar signal SREF may transfer the first active pulse RACTD1<7> to the counting control signal generation unit 3022 (see Z1-1) to enable the counting control signal EN_PRE1<7> (see Z1-2).

The toggling of the second pre active pulse RACTD2<7> may not be transmitted to the active section signal generator 362 since the self-refresh operation signal SREF is disabled at the logic low level for the current self-refresh operation exit mode SREF_DIS, and thus the second transfer controller 324 may be disabled according to the disablement of the self-refresh operation signal SREF.

An active section signal TRAS_MIN<7> may be enabled (see Z2) in response to the toggling of the first active pulse RACTD1<7>.

As described above, the counting control signal EN_PRE1<0> may be firstly enabled in the beginning of the self-refresh operation exit mode SREF_DIS (see Z1-1 and Z1-2), in which the operation clock CLK toggles. Therefore, the counter 304 may perform a counting operation (see Z3-1, Z3-2 and Z3-3) in response to the continuous toggling of the operation clock CLK. When the number of toggles of the counting clock CNT_CLK<0:7> or the operation clock CLK reaches the predetermined number, for example, four times, the counter 304 may generate the counting result pulse CNT_OUT<7> toggling according to the predetermined number, for example, four times (see Z6-1).

The counting control signal EN_PRE1<7> may then be disabled in response to the counting result pulse CNT_OUT<7> (see Z6-2).

The counting result pulse CNT_OUT<7> may be transferred (EN_PRE2<7>) to the active section signal generator 362 (see Z7), and the active section signal TRAS_MIN<7> may be disabled in response to the counting result pulse CNT_OUT<7> by the active section signal generator 362.

Sensing the disabling of the active section signal TRAS_MIN<7>, a pre-charge pulse PRECG<7> toggles after the third time delay D3.

It may be seen from the above description that the self-refresh operation for the eighth bank, after the self-refresh operation for the first bank at the time of mode change from the self-refresh operation mode SREF_EN to the self-refresh operation exit mode SREF_DIS, may be activated in response to the active command RACT<7>, and when the toggling number of the operation clock CLK reaches the predetermined number, the eighth bank may be pre-charged in response to the operation of the first pre-charge control block 300 toggling the pre-charge pulse PRECG<7>.

As described above, even though the self-refresh operation for the first bank is performed at the time of the mode change from the self-refresh operation mode SREF_EN to the self-refresh operation exit mode SREF_DIS, the minimal time TRAS_MIN to stably perform the active operation for the bank subsequent to the first bank may be secured.

According to the embodiments of the present invention, the operation of counting the number of toggles of the operation clock CLK, which is performed to decide when the pre-charge operation starts based on the operation clock CLK, may be disabled in the self-refresh operation mode SREF_EN.

Therefore, it is possible to secure the minimal time TRAS_MIN to stably perform the active operation for the bank subsequent to the first bank even though a piled refresh operation is performed at the time of mode change from the self-refresh operation mode SREF_EN to the self-refresh operation exit mode SREF_DIS.

According to an embodiment of the present invention, the semiconductor memory device may secure the minimal time TRAS_MIN to stably perform the active operation for the bank subsequent to the first bank during the self-refresh operation by disabling the operation for counting the number of toggles of the operation clock in order to decide when the pre-charge operation starts based on the operation clock in the self-refresh operation section, even though the self-refresh operation for the first bank is performed at the time of mode change from the self-refresh operation mode SREF_EN to the self-refresh operation exit mode SREF_DIS.

While the present invention has been described with respect to the specific embodiments, it will be apparent to those skilled in the art that various changes and modifications may be made without departing from the spirit and scope of the invention as defined in the following claims.

For example, the embodiments of the present invention are described by taking an example where there are 8 banks in a semiconductor memory device, but the number of the banks is illustrative and not restrictive. According to another embodiment of the present invention, the number of the banks may be more or less than 8.

What is claimed is:

1. A semiconductor memory device, comprising:
    a first pre-charge control block suitable for generating a first control signal by counting a number of toggles of an operation clock in response to a first active pulse in a self-refresh operation exit mode;
    a second pre-charge control block suitable for generating a second control signal in response to an active command for an active operation in a self-refresh operation mode; and
    an operation control block suitable for disabling the first pre-charge control block in the self-refresh operation mode, and disabling the second pre-charge control block in a self-refresh operation exit mode, wherein
    a pre-charge operation starts in response to the first and second control signals after the active operation.

2. The semiconductor memory device of claim 1, further comprising:
    a first active pulse generation block suitable for generating the first active pulse by delaying the active command; and
    a pre-charge operation block suitable for generating a pre-charge operation signal for the pre-charge operation in response to the first active pulse and one of the first or second control signal.

3. The semiconductor memory device of claim 1, wherein the first pre-charge control block includes:
    a counter suitable for generating the first control signal by counting a number of toggles of a counting clock; and
    a counting clock generator suitable for providing the counting clock to the counter based on the operation clock, and enabled in response to the first active pulse or disabled in response to the first control signal, where whether to provide the counting clock or not is decided based on an output signal of the operation control block.

4. The semiconductor memory device of claim 1, wherein the second pre-charge control block generates the second control signal by delaying the active command, where whether to generate the second control signal is decided in response to an output signal of the operation control block.

5. The semiconductor memory device of claim 3, wherein the counting clock generator includes:
   a counting control signal generation unit suitable for generating a counting control signal that is enabled in response to the first active pulse and disabled in response to the first control signal;
   a counting clock output unit suitable for generating the counting clock based on the operation clock in response to the counting control signal; and
   a first transfer control unit suitable for transferring the first active pulse to the counting control signal generation unit in response to an output of the operation control block.

6. The semiconductor memory device of claim 4, wherein the second pre-charge control block includes:
   a second active pulse generator suitable for generating the second control signal by delaying the active command; and
   a second transfer controller suitable for transferring the second control signal to the pre-charge operation block in response to an output of the operation control block.

7. The semiconductor memory device of claim 1, wherein the operation control block includes:
   a self-refresh operation signal generator suitable for generating a self-refresh operation signal that is enabled in the self-refresh operation mode and disabled in the self-refresh operation exit mode; and
   an operation signal outputter suitable for outputting a self-refresh operation bar signal to the first pre-charge control block, and outputting the self-refresh operation signal to the second pre-charge control block.

8. The semiconductor memory device of claim 2, wherein the pre-charge operation block includes:
   an active section signal generator suitable for generating an active section signal that is enabled in response to the first active pulse and disabled in response to the first or second control signal; and
   a pre-charge pulse generator suitable for generating the pre-charge operation signal for the pre-charge operation by sensing disablement of the active section signal.

9. A method for operating a semiconductor memory device, comprising:
   generating a first control signal by counting the number of toggles of an operation clock in response to a first active pulse in a self-refresh operation exit mode, wherein the generating of the first control signal is disabled in a self-refresh operation mode; and
   generating a second control signal in response to an active command for an active operation in the self-refresh operation mode, wherein the generating of the second control signal is disabled in the self-refresh operation exit mode, and wherein a pre-charge operation starts in response to the first and second control signals after the active operation.

10. The method of claim 9, further comprising:
    generating the first active pulse by delaying the active command; and
    generating a pre-charge operation signal for the pre-charge operation in response to the first active pulse and one of the first or second control signal.

11. The method of claim 9, wherein the generating of the first control signal includes:
    generating the first control signal by counting a number of toggles of a counting clock;
    generating a counting control signal that is enabled in response to the first active pulse and disabled in response to the first control signal, wherein the counting control signal is disabled when a self-refresh operation signal is enabled; and
    generating the counting clock based on the operation clock in response to the enabled counting control signal.

12. The method of claim 9, wherein the generating the second control signal generates the second control signal by delaying the active command, where whether to generate the second control signal is decided in response to the self-refresh operation signal.

13. The method of claim 10, wherein the generating the pre-charge operation signal includes:
    generating an active section signal that is enabled in response to the first active pulse and disabled in response to the first or second control signal; and
    generating the pre-charge operation signal for the pre-charge operation by sensing disablement of the active section signal.

* * * * *